United States Patent
Lajnef et al.

(10) Patent No.: US 9,793,830 B2
(45) Date of Patent: Oct. 17, 2017

(54) SELF-POWERED SENSING SYSTEM FOR THE MONITORING OF QUASI-STATIC STRUCTURAL RESPONSE

(71) Applicant: Board of Trustees of Michigan State University, East Lansing, MI (US)

(72) Inventors: Nizar Lajnef, Lansing, MI (US); Shantanu Chakrabartty, Williamston, MI (US); Rigoberto Burgueno, East Lansing, MI (US); Borchani Wassim, Lansing, MI (US)

(73) Assignee: Board of Trustees of Michigan State University, East Lansing, MI (US)

( * ) Notice: Subject to any disclaimer, the term of this patent is extended or adjusted under 35 U.S.C. 154(b) by 0 days.

(21) Appl. No.: 15/022,046

(22) PCT Filed: Sep. 16, 2014

(86) PCT No.: PCT/US2014/055871
§ 371 (c)(1),
(2) Date: Mar. 15, 2016

(87) PCT Pub. No.: WO2015/039103
PCT Pub. Date: Mar. 19, 2015

(65) Prior Publication Data
US 2016/0233797 A1    Aug. 11, 2016

Related U.S. Application Data

(60) Provisional application No. 61/878,113, filed on Sep. 16, 2013.

(51) Int. Cl.
*G01B 7/16* (2006.01)
*H02N 2/18* (2006.01)
(Continued)

(52) U.S. Cl.
CPC ............... *H02N 2/181* (2013.01); *G01D 9/00* (2013.01); *G01K 5/00* (2013.01); *G01L 9/08* (2013.01); *H02N 2/18* (2013.01); *H01L 41/1136* (2013.01)

(58) Field of Classification Search
CPC ............ H02N 2/18; H02N 2/181; G01D 9/00; G01K 5/00; G01L 9/08; H01L 41/1136
USPC .................................................. 73/763, 777
See application file for complete search history.

(56) References Cited

U.S. PATENT DOCUMENTS 5,825,275 A    10/1998  Wuttig et al.
8,193,926 B2*  6/2012   Sinnett ................ B60C 23/0493
                                                              340/442

(Continued)

FOREIGN PATENT DOCUMENTS

WO    WO-2013126181 A1    8/2013

OTHER PUBLICATIONS

Huang et al "Calibration and Characterization of Self-Powered Floating-Gate Usage Monitor With Single Electron Per Second Operational Limit", IEEE Transactions on Circuits and Systems, (Mar. 2010).

(Continued)

*Primary Examiner* — Max Noori
(74) *Attorney, Agent, or Firm* — Harness, Dickey & Pierce, PLC

(57) ABSTRACT

A self-powered sensing system is provided for the monitoring of quasi-static structural responses. The sensing system is comprised of: an energy concentrator having a member configured to detect a variation of a physical stimuli and change shape in response to the variation of the physical stimuli, where the variation typically occurs at a frequency less than one Hertz; a transducer coupled the member of the energy concentrator and generates a voltage in response to (Continued)

the change in shape of the member; and an event logging circuit configured to receive the voltage from the transducer and log the voltage in a non-volatile memory. Physical stimuli may include temperature, pressure or an applied force.

18 Claims, 10 Drawing Sheets

(51) Int. Cl.
      *G01D 9/00*       (2006.01)
      *G01K 5/00*       (2006.01)
      *G01L 9/08*       (2006.01)
      *H01L 41/113*       (2006.01)

(56) References Cited

U.S. PATENT DOCUMENTS

| | | | |
|---|---|---|---|
| 2003/0097838 A1* | 5/2003 | Yazawa | F02G 1/043 60/527 |
| 2006/0243056 A1 | 11/2006 | Sundermeyer et al. | |
| 2007/0102037 A1* | 5/2007 | Irwin | F24J 2/52 136/246 |
| 2008/0047355 A1 | 2/2008 | Chakrabartty et al. | |
| 2009/0120200 A1* | 5/2009 | Chakrabartty | A61F 2/468 73/808 |
| 2009/0171294 A1 | 7/2009 | Johnson et al. | |
| 2010/0182809 A1* | 7/2010 | Cullinane | H02P 9/02 363/34 |
| 2013/0124118 A1 | 5/2013 | Monda et al. | |

OTHER PUBLICATIONS

Cottone et al "Piezoelectric Buckled Beams for Random Vibration Energy Harvesting", Smart Mater. Struct. 21 (Feb. 2012).
A. Fetemi et al "Cumulative Fatigue Damage and Life Prediction Theories: A Survey of the State of the Art for Homogeneous Materials", Int. J. Fatigue, vol. 20, No. 1 (1998).
Rathod et al "Probabilistic Modeling of Fatigue Damage Accumulation for Reliability Prediction", Int. Journal of Quality, Statistics and Reliability, vol. 2011 (2011).

\* cited by examiner

SELF-POWERED SENSING SYSTEM FOR THE MONITORING OF QUASI-STATIC STRUCTURAL RESPONSE

CROSS-REFERENCE TO RELATED APPLICATIONS

This application is a national phase of PCT/US2014/055871, filed Sep. 16, 2014 which claims the benefit of U.S. Provisional Application No. 61/878,113, filed on Sep. 16, 2013. The entire disclosures of the above applications are incorporated herein by reference.

FIELD

The present disclosure relates to a self-powered sensing system for the monitoring of quasi-static structural response.

BACKGROUND

One of the major disadvantages of the current state-of-the-art electro-mechanical energy scavengers for some civil, mechanical and biomechanical applications is their narrow-band frequency response which is concentrated around high frequencies. For instance a vibration based scavenger with an overall volume limited to less than 5 $cm^3$ will exhibit a resonant frequency in the range of 50-300 Hz. In literature several broad-band energy scavenging techniques have been proposed that can extend the operating frequency range. However, many real-world processes span frequencies and acceleration levels where its intrinsic energy cannot be scavenged using these technologies and hence have been largely unexplored to date. Some examples of these processes include fundamental vibration modes in large civil structures that span frequencies less than 5 Hz. Likewise changes in physical processes like temperature and pressure variations between day and night induce a stress/strain response in structures that occur at frequencies lower than 1 mHz. In biomedical engineering, changes in in-vivo strain levels during bone-healing and spinal fusion processes span from a few days to up to a few months. In all these processes monitoring the evolution of quasi-static strain is important and could provide significant benefits. For instance the history of mechanical loading inside different structures could be used to predict the life expectancy of the structure. A more challenging prospect and the main focus of this disclosure is to design battery-less sensors that can self-power for harvesting energy directly from these quasi-static processes.

The technical challenge is illustrated for a piezoelectricity driven self-powered sensor whose generic architecture is shown in FIG. 1A. The sensor comprises of a piezoelectric transducer that powers a minimal set of electronic modules by harvesting energy from ambient strain variations. Typically the sensor electronics comprises of: (a) a rectification module to extract the energy from the transducer; (b) a triggering module that detects events of interest; and (c) a data-logging module that records events either on a non-volatile memory or using remote data transmission. When the piezoelectric transducer is excited quasi-statically (as shown in FIG. 1B by the triangular wave) the load voltage generated by the transducer is approximately constant as shown in FIG. 1B. Assuming a nominal sized piezoelectric transducer, the power levels that can be scavenged from mHz strain-signal would be in the order of pico-watts. Unfortunately, the majority of the charge generated by the transducer is lost as leakage through the electronics (for example through diode leakage) and the residual energy is insufficient to drive the rest of the sensor modules (triggering and data-logging modules).

This section provides background information related to the present disclosure which is not necessarily prior art.

SUMMARY

This section provides a general summary of the disclosure, and is not a comprehensive disclosure of its full scope or all of its features.

A self-powered sensing system is provided for the monitor quasi-static structural responses. The sensing system is comprised of: an energy concentrator having a member configured to detect a variation of a physical stimuli and change shape in response to the variation of the physical stimuli; a transducer coupled the member of the energy concentrator and generates a voltage in response to the change in shape of the member; and an event logging circuit configured to receive the voltage from the transducer and log the voltage in a non-volatile memory. Physical stimuli may include an applied force, temperature or pressure.

In one embodiment, the self-powered system includes an energy concentrator having a buckling member that exhibits a snap-through event in response to a force applied thereto and a transducer coupled to the buckling member and generates a voltage in response to the occurrence of a snap-through event of the buckling member.

The buckling member may be further defined as a strip having two opposing planar surface substantially wider than remaining surfaces, where the strip is constrained by a first wall disposed adjacent to one planar surface of the strip and a second wall disposed adjacent to other planar surface of the strip. Thus, the buckling member is configured to exhibit snap-through events between three or more stable positions.

The transducer may be further defined as a cantilever having one end coupled to the buckling member, such that the cantilever extends outwardly from the buckling member and includes a piezoelectric material disposed on a surface thereof.

The event logger includes a current reference circuit configured to receive the voltage signal from the transducer and, in response thereto, output an injection current into the non-volatile memory, where the non-volatile memory can be implemented by a floating gate transistor. The event logger further includes a full-bridge rectifier interposed between the transducer and the current reference circuit as well as an operational amplifier interfaced with the floating gate transistor of the non-volatile memory to ensure that the source-to-drain voltage of the floating gate transistor is held constant.

In another embodiment, the energy concentrator is implemented by a hollow cylinder configured to exhibits a snap-through event in response to a force applied axially thereto, where magnitude of the force changes at a frequency less than one Hertz and the snap-through event is constrained laterally by curvature of the cylinder.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

Figure 1A:
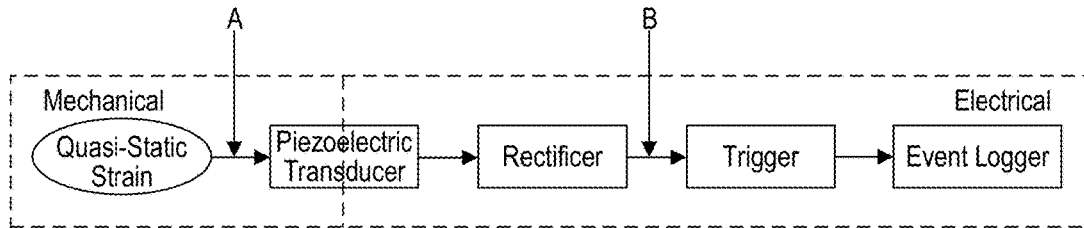
FIG. 1A is a diagram depicting a system architecture of a generic piezoelectric driven self-powered sensor.
Figure 1B:
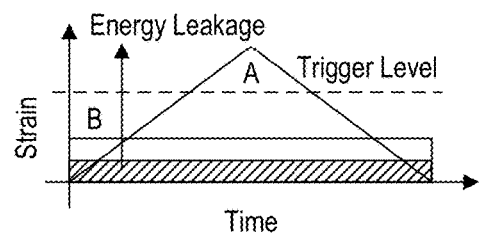
FIG. 1B is a graph depicting adverse effect of electronic leakage on energy scavenging for quasi-static excitation.
Figure 2A:
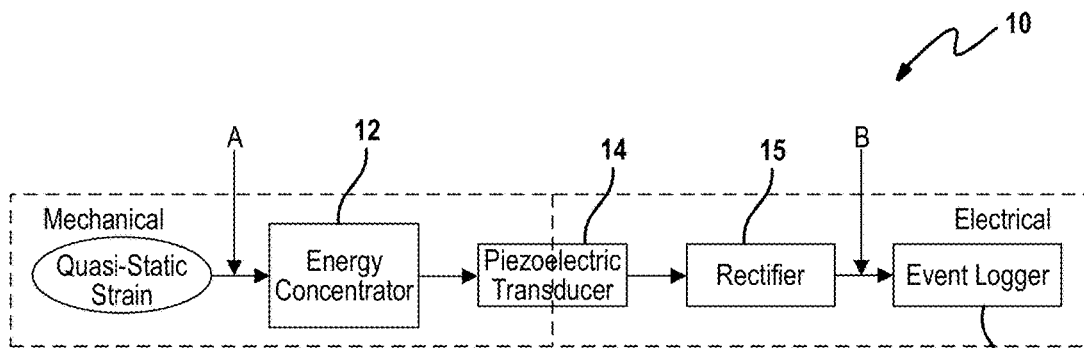
FIG. 2A is a diagram depicting a system architecture for a proposed self-powered sensor.
Figure 2B:
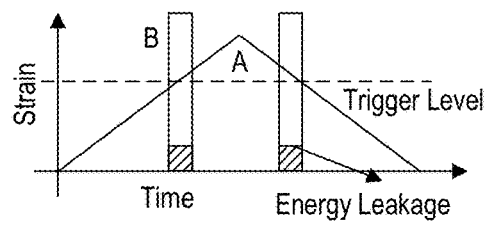
FIG. 2B is a graph depicting reduction of electronic leakage during the impulsive energy release of energy concentrators.

FIG. 2A depicts a system architecture for a proposed self-powered sensor 10. The self-powered sensor 10 is comprised of an energy concentrator 12, a transducer 14 and an event logger 16. The energy concentrator 12 serves as a front end to circumvent the challenge of quasi-static self-powering. The energy concentrator 12 includes a member configured to detect a variation of a physical stimuli, such as a quasi-static force, and changes shape in response to the variation of the physical stimuli, where the variation occurs at a frequency less than one Hertz. Thus, the role of the energy concentrator is to harvest potential energy over a long time-span and release the stored energy in bursts as shown in FIG. 2B. The impulsive nature of the energy-release not only results in piezoelectric output voltage levels that are significantly higher than the triggering but also reduces the effect of energy leakage as shown in FIG. 2B.

A transducer 14 is coupled the energy concentrator 12 and generates a voltage in response to the change in shape of the member. An event logger 16 is configured to receive the voltage from the transducer 14 and operates to log the voltage in a non-volatile memory. A rectifier 15 may be interposed between the transducer 14 and the event logger 16. While reference is made to the physical stimuli being a quasi-static strain, other types of stimuli, such as temperature or pressure changes, are also contemplated by this disclosure.

Figure 3:
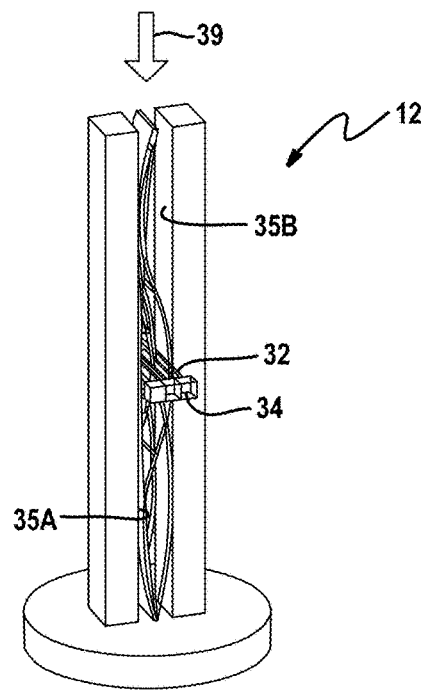
FIG. 3 is a diagram depicting an example embodiment of an energy concentrator.

FIG. 3 illustrates an example embodiment for an energy concentrator 12 which can be used in the self-powered sensor 10. In the example embodiment, the energy concentrator 12 is comprised of a buckling strip 31 that exhibits a snap-through event in response to a force applied thereto. More specifically, the buckling strip 31 is defined by two opposing planar surfaces 33 substantially wider than the remaining surfaces of the strip. By constraining the buckling strip laterally, the strip is able to exhibit multiple snap-through events between stable positions. In the example embodiment, the buckling strip 31 is constrained by two surfaces or walls 35A, 35B, where a first wall is disposed adjacent to one planar surface and a second wall is disposed adjacent to the other planar surface of the strip.

A transducer 14 converts the motion of the strip to electrical energy. In the example embodiment, the transducer 14 is implemented by a cantilever 32 coupled to and extending outwardly from the bucking strip 31. The transducer 14 further includes a piezoelectric material disposed on a surface thereof and a mass 34 disposed at an opposing end from the coupling to the strip. Different types of piezoelectric material may be used, including but not limited to lead zirconate titanate (PZT) and semi-crystalline plastic polyvinylidene fluoride (PVDF). The cantilever 32 is preferably positioned along the strip at a location that experiences the greatest lateral acceleration during a snap-through event. This position can vary for different post-buckling positions. Thus, the cantilever 32 can also be placed at the locations of maximum transverse amplitude of the buckling strip. The mounting of more than one cantilever along the length of the strip is contemplated. Other types of transducers are also contemplated by this disclosure. Further information regarding the example embodiments of the energy concentrator 12 and transducer 14 may be found in U.S. Patent Application Publication No. 2014/0070670 which is incorporated in its entirety by reference.

Figure 4A:
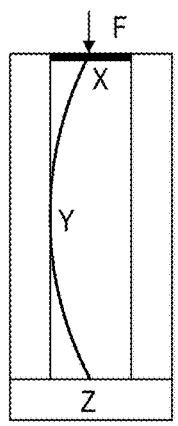
FIGS. 4A-4C illustrate different bucking states for a bilaterally contrained strip.
Figure 4B:
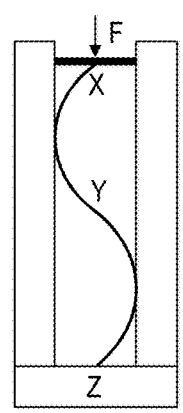
Figure 4C:
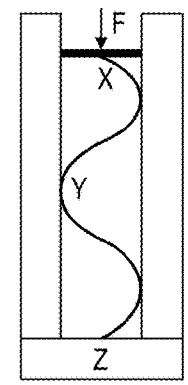
Figure 4D:
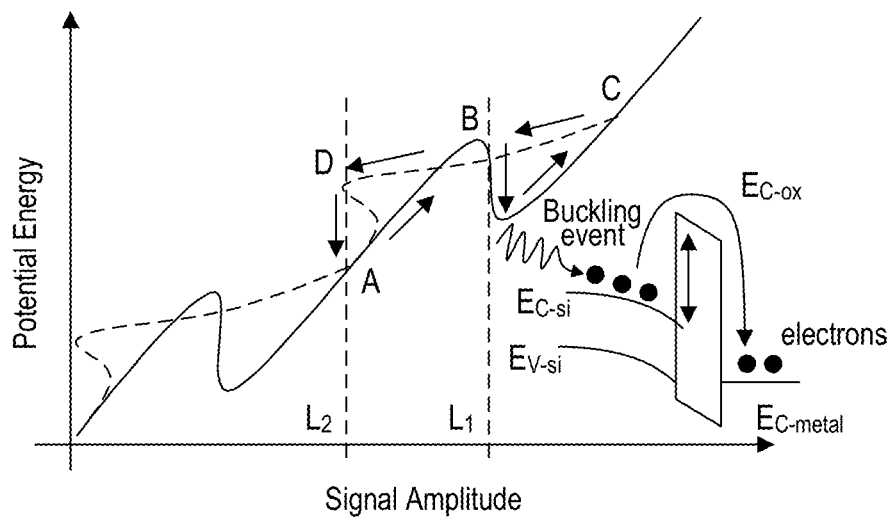
FIG. 4D is an energy diagram illustrating how the released potential energy induces hot-electrons in a floating-gate transistor channel.

FIGS. 4A-4D further illustrate the physics and principle of operation of the buckling strip. FIG. 4D is a sketch of an energy diagram (not drawn to scale) showing the potential energy stored in the elastic strip as the magnitude of the quasi-static force (F) is increased (solid-line) and decreased (dotted-line). Note that under quasi-static loading conditions no energy is dissipated as kinetic energy or heat except during snap buckling events. Assuming that the strip is initially in an energy configuration denoted by state A, increasing the magnitude of the input signal (force) shifts the configuration to a higher potential energy state B. State B corresponds to the position of the strip shown in FIG. 4A. Because the strip is bilaterally constrained (at point Y), increasing the magnitude of the input signal (F) buckles the beam to another state shown in FIG. 4B. On the energy-diagram shown in FIG. 4D, the mechanical buckling (instability) results when the energy state reaches the inflexion point B. If a piezoelectric transducer is attached to the structure, part of the kinetic energy due to buckling is transferred to the transducer which is then scavenged for sensing and computation. On the other hand when the external force (signal) is reduced, the elastic strip follows the trajectory from state C to state D where another inflexion point is encountered. At this state, the strip unbuckles to a lower energy state A. Again, the kinetic energy due to the unbuckling could be scavenged by a piezoelectric transducer. The impulsive nature of the energy-release (during buckling and unbuckling) not only results in higher piezoelectric output voltage (due to the high frequency transitions) but it also significantly reduces the effect of electronic leakage.

The engineering challenge is to achieve an optimal trade-off between the energy released during buckling (which is related to the material properties of the strip, the end boundary conditions and the lateral constraints) and the energy required for sensing and computation. One possible way to optimize this trade-off is to exploit the physics of mechanical buckling and the physics of piezoelectricity driven impact-ionized hot electron injection. This principle is also illustrated using the energy-band diagram in FIG. 4D where the piezoelectric transducer converts the released kinetic energy (equivalently acoustic energy) into high-energy electrons (or hot-electrons) in a floating-gate transistor. If the energy of some of these electrons (with the right momentum vector) exceeds the energy barrier (3.2 eV) of the silicon, silicon-di-oxide interface (as shown in FIG. 4(d)), these electrons surmount the barrier and get trapped onto a floating-gate. The concentration of the trapped electrons can be measured to estimate the number of times the magnitude of the input signal exceeded a mechanical threshold (for instance $L_1$ or $L_2$ in FIG. 4(d)). The electron injection process can be initiated at pico-Joule energy density, which as shown in this disclosure is well matched to the energy released during mechanical buckling of a nominally sized elastic beam. The beauty of this physics-based sensing approach is that it completely eliminates the need for voltage regulation, energy storage, analog-to-digital converters (ADCs), micro-controller units (MCUs) and random-access memories (RAMs) and hence can be used to push the fundamental limits of self-powered sensing using sub-Hz signals.

In one embodiment, the design of the mechanical energy concentrator follows a test setup in which a polycarbonate strip (properties in Table I) with fixed end supports is placed between rigid continuous bilateral plexiglass frame. Properties for the polycarbonate strip are in the table below.

TABLE I

| Elastic Modulus | 2.3 GPa |
| Length | 250 mm |
| Width | 30 mm |
| Thickness | 2.3 mm |

The optically clear plexiglass acrylic frame was chosen to be 1 inch thick and was designed to have a gap of 4 mm for transverse deformations. Axial loading was gradually applied to the column using a mechanical test system (MTS model Flextest 40 with series 370 load unit) which induced multi-stable post-buckling configurations. A PVDF based pieozoelectric energy-harvester was attached at the buckled column's mid-span perpendicular to its longitudinal axis using an off-the-shelf 5 minute epoxy (J-B weld 5 min epoxy). Properties for the transducer are in the following table.

TABLE II

| Elastic Modulus | 2 GPa/2.4 GPa |
| Density | 1780 kg/m$^3$/1390 kg/m$^3$ |
| Thickness | 28 μm/205 μm |
| Width | 12 mm/16 mm |
| Piezoelectric Constant ($d_{31}$) | 23 × 10$^{-12}$ m/V |
| Capacitance | 2.8 nF |
| Electrical permittivity | 115 × 10$^{-12}$ F/m |

The harvester was configured in a cantilever configuration and only one piezoelectric element was used for the design. However, multiple transducer elements with different properties as well as other piezoelectric materials (e.g., PZT, Microfiber Composites, etc) can be used for enhancing the energy transfer. The length and tip mass on the cantilever was optimized to its natural frequency response. The snap-through buckling of the axially loaded strip/column between equilibrium positions induces acceleration at the base of the cantilever, thus transferring the low-rate strains in the buckled column's axial direction into high-rate accelerations input for the harvester.

Figure 5:
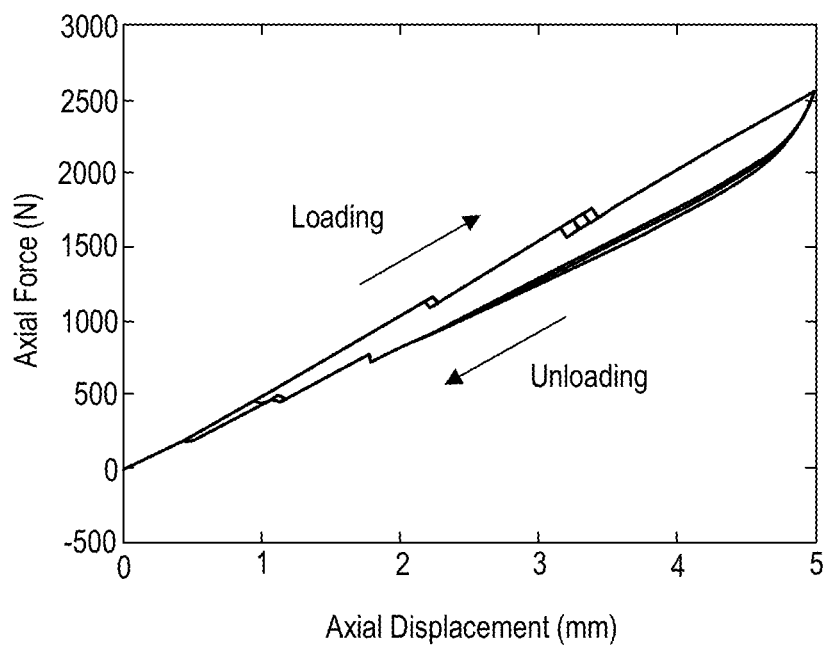
FIG. 5 is a graph depicting post-buckling behavior for displacement control pseudo-static cyclic loading tests at 0.16 Hz, 0.05 Hz, 0.025 Hz and 0.006 Hz.
Figure 6:
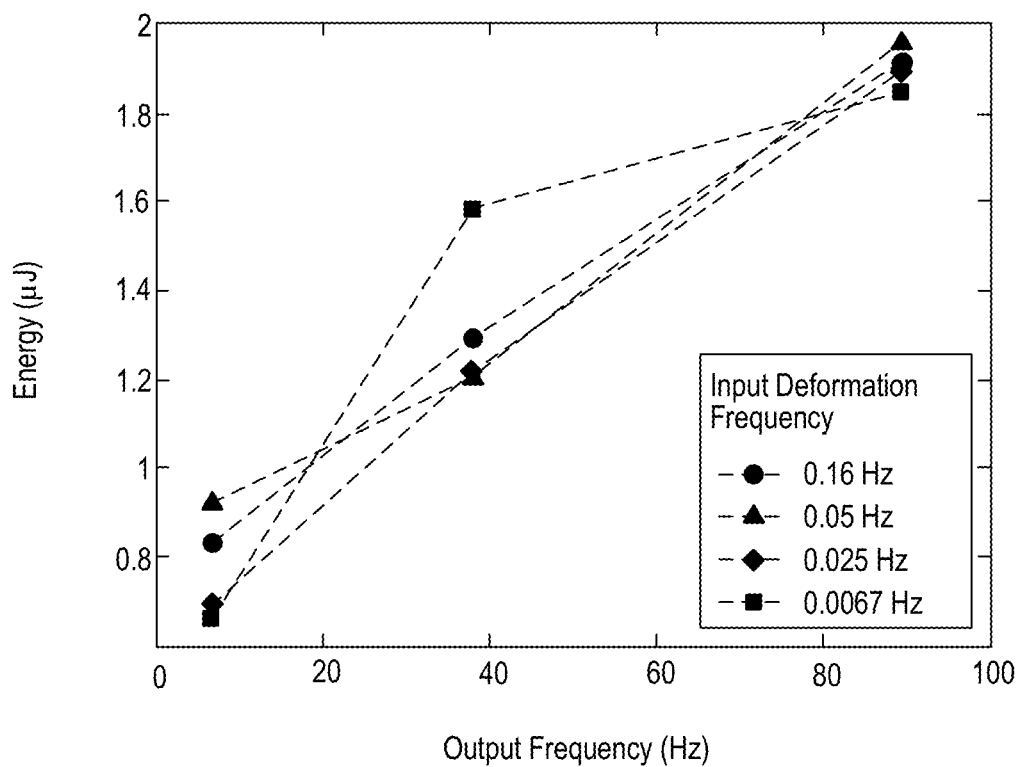
FIG. 6 is a graph depicting output harvested energy for different piezoelectric elements and input loading rates.

Displacement-controlled cyclic loading tests were performed at 0.16 Hz, 0.05 Hz, 0.025 Hz and 0.006 Hz. The force-displacement responses are shown in FIG. 5. The drops in the columns axial force are indicative of mode jumping between stable configurations and are proportional to the available harvestable energy. FIG. 6 shows the computed energy generated by the cantilever piezoelectric PVDF beam (Table II) during one full loading-unloading cycle. The response was measured across a 10 MΩ resistor. The natural frequency of the harvester was varied in the range 10 Hz to 90 Hz by modifying the effective length of the PVDF film and the tip mass. Different curves were obtained for different input deformation rates. The results show that energy can be transferred at extremely low-rate deformation input. An important and unique characteristic of the test system is that occurrence of the snap-buckling events is independent of the frequency of the input axial deformations (duration of the loading and unloading cycles). The levels of harvested energy as well as the output signal frequency can be tuned (optimized) by controlling the piezoelectric and the buckled column properties. It should be restated that other piezoelectric materials (e.g., PZT, MFC) can be used for enhanced energy transfer.

Figure 7A:
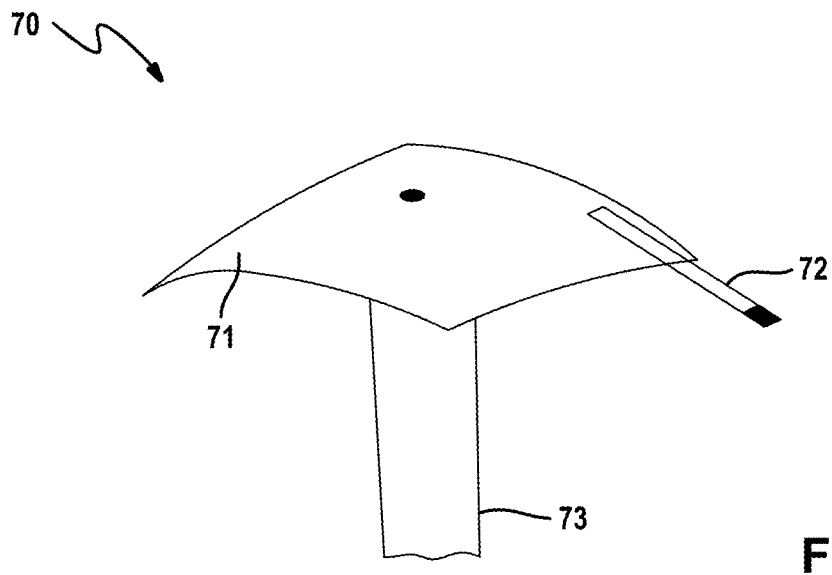
FIG. 7A is a diagram depicting another example embodiment of an energy concentrator.

FIG. 7A illustrates an alternative example for the energy concentrator 70, a bistable plate. Bistable laminated plates 71 were manufactured by introducing residual stresses due to thermal cool down from their curing temperature. The residual thermal stresses in the thin plates lead to stable shapes with opposing mid-plane curvatures. An oscillator 72 comprised of a piezoelectric material is mounted on one of the plate's corners in a cantilever configuration. For testing, the plates were attached at their center to a fixed base 73. An actuator was moved vertically up and down at very low rates to apply load at two opposing plate corners and induce the snap-through between stable positions in both directions.

In an example embodiment, four asymmetric plates of the family $[(90-o)_n/o_n]$ with two and four plies were manufactured with specific laminates of $[-30/60]$, $[-30_2/60_2]$, $[-15/75]$, $[-15_2/75_2]$, $[0/90]$, $[-0_2/90_2]$. All plates were 102 mm square and manufactured with unidirectional carbon/epoxy prepeg material (see properties in Table 3 below).

TABLE 3

Ply Properties of Unidirectional Carbon/Epoxy Prepeg

| | |
|---|---|
| $E_{11}/E_{22}$ | 112.8 GPa/8.85 GPa |
| $G_{12}$ | 4.96 Gpa |
| $v_{12}$ | 0.27 |
| $\alpha_{11}$ | 4.4e−7 m/m/° C. |
| $\alpha_{22}$ | 2.8 e−5 m/m/° C. |
| $\alpha_{12}$ | 2.2 e−3 m/m/° C. |
| $t_{ply}$ | 0.165 mm |

Of the noted properties, $E_{11}$ and ply thickness were measured while the other values were estimated through simple micro-mechanics models. The plates were cured curved on a cylindrical mold in an autoclave and were exposed to a temperature decrease of 85° C. upon cool down to room temperature. The curved configuration and the residual thermal stresses lead to two stable shapes with opposing mid-plane curvatures. Transition between the two stable geometries creates a snap-through response, which requires that a moment be applied to the plate to initiate the transition.

Figure 7B:
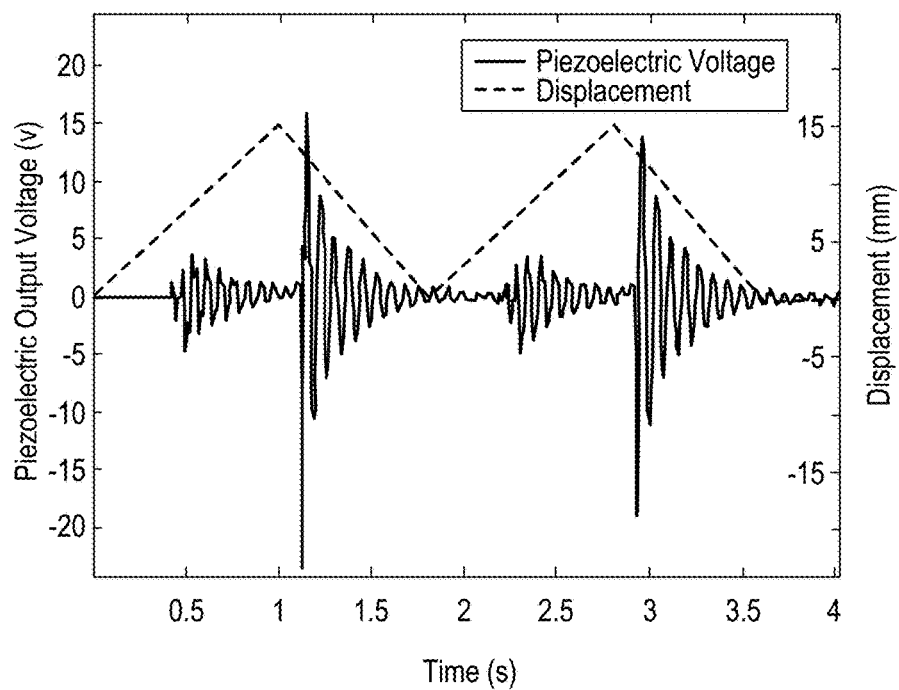
FIG. 7B is a graph depicting output voltage produced by a transducer in response to displacement of a bistable plate.

FIG. 7B shows the piezoelectric output voltage for two full displacement cycles applied to a [−30/60] plate. The actuator was moved at a frequency of 0.55 Hz while the induced oscillations at the cantilever beam were measured at 12.82 Hz. It can be seen from the levels of generated voltage that the transitions are not symmetric between the two stable positions. This can be explained by the levels of residual energy in the system, which is affected by the fiber orientations and the manufacturing process. It can also be noted that the load required to initiate the snap-through event was less than 0.5 N. Thus, this system can also be used for load amplification at low-rate deformations.

Figure 8:
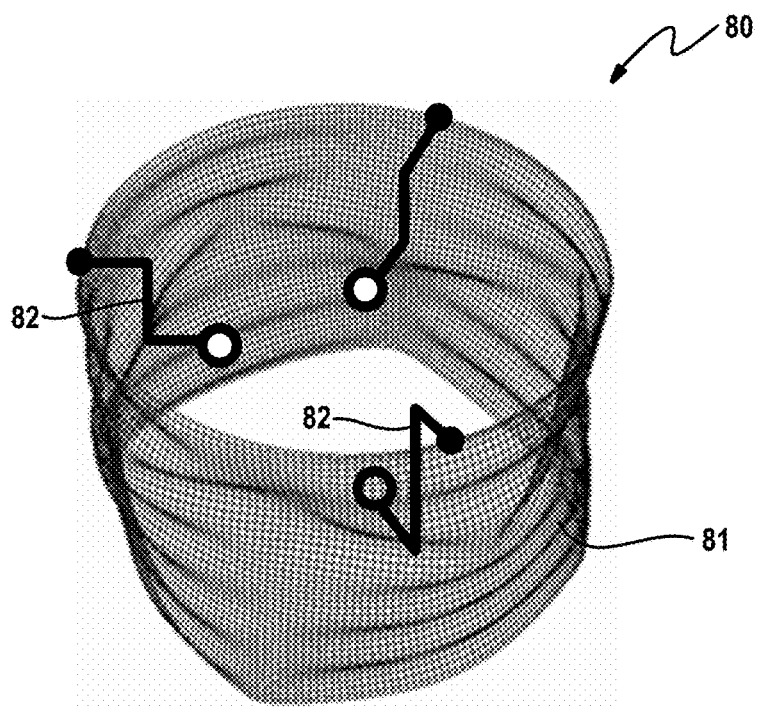
FIG. 8 is a diagram depicting yet another example embodiment of an energy concentrator.

FIG. 8 illustrates another example an energy concentrator 80. In this example, the energy concentrator 80 is comprised generally of a hollow cylinder 81. Multiple elastic postbuckling responses of cylindrical shells is possible due to the inherent lateral restraint provided, for example by the circumferential radial stresses generated by the curvature. However, the large sensitivity to imperfections limits the number of stable postbuckling modes that can be attained before nonlinear local buckling dominate the response. Nonetheless, the radial curvature of the cylinder provides a restraint that allows for multistable postbuckling response when loaded in compression.

One or more cantilevers 82 are coupled at one end to the cylinder 80. The cantilevers 92 extend away from the attached surface and can support a mass at a distal end thereof. It is understood that the cantilevers could extend inward from an inner surface of the cylinder or extend outward from an outer surface of the cylinder. It is also understood the cantilevers may be placed at different positions along the attachment surface. Although not limited thereto, this type of energy concentrator is particularly suitable for detecting changes in pressure.

Figure 9A:
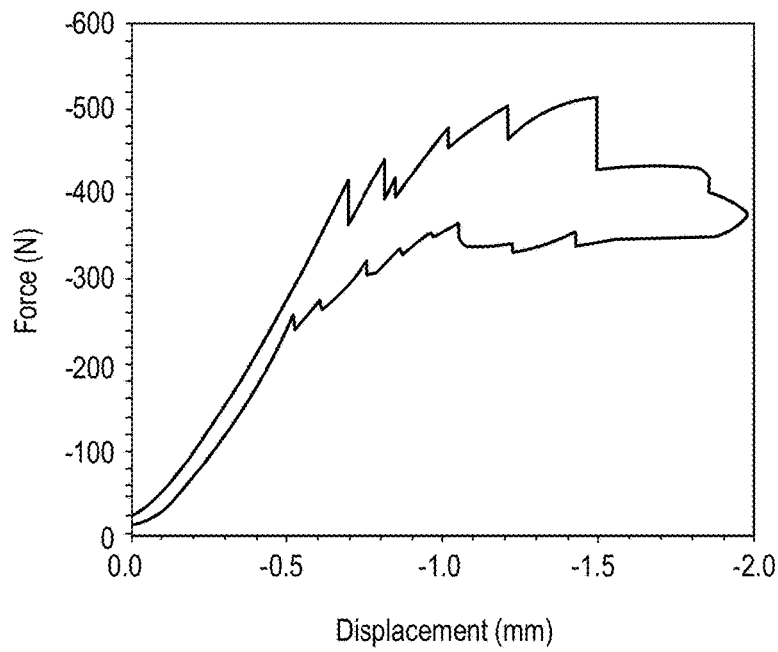
FIGS. 9A and 9B are graphs illustrating an experimental and simulated, respectively, loading cycle on the energy concentrator depicted in FIG. 8.
Figure 9B:
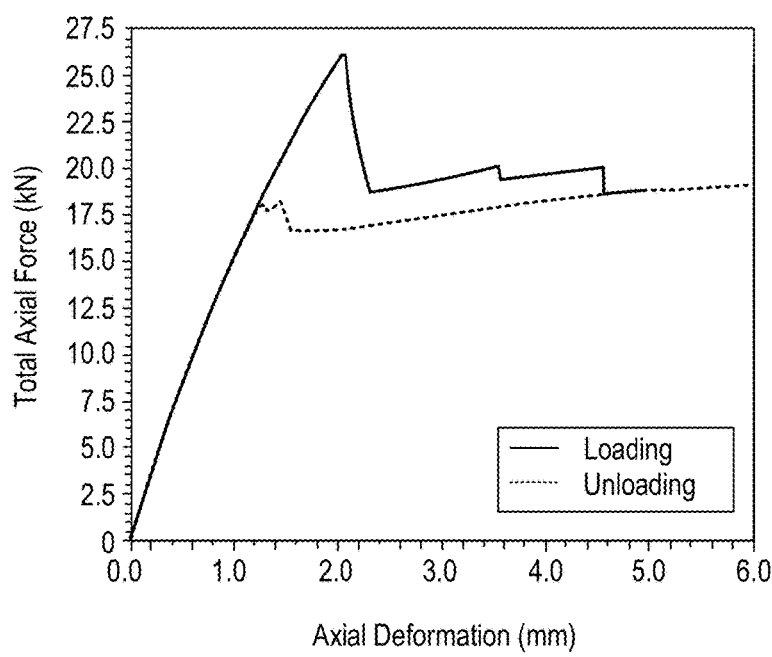

An experimental and numerical investigation was conducted to confirm that static path jumping could be achieved in cylinders under compression. FIGS. 9A and 9B illustrate an experimental and simulated loading cycle on the energy concentrator 80, respectively. FIG. 9A shows one loading cycle for a polyester (E=21 kPa) cylinder (D=80 mm, L=152 mm, t=0.533 mm). The data show that mode jumping was attained and that deformations were fully recovered. Mode jumping also occurs during unloading. As expected, the cylinder response is influenced by multiple closely spaced bifurcation points, each a snap-through event. This poses challenges as it is of interest to have distinct and spaced buckling shapes that facilitate the tuning of behavior and maximize the energy released when switching between the post-buckled stable branches. A similar behavior was observed in numerical simulations as shown in FIG. 9B, albeit with a "cleaner" response probably due to the limited number of imperfections seeded in the model. The FEA analysis shown is on a polyester (E=21 kPa) cylinder (D=400 mm, L=600 mm, t=1.2 mm). The analysis was able to capture the major path jumping events but not the smaller ones, which most noticeably influenced the unloading response.

Understanding how the postbuckling behavior can be controlled is an important step towards harnessing such instability phenomenon. First, the equilibrium path is expected to have multiple mode transitions rather than a single bifurcation point. From a physical perspective, the number of multiple mode transitions (k) indicates the localized elastic interactions of the cylindrical shell while one larger jump may indicate damage. A second feature of interest is the magnitude of the drops in load ($\Delta P_i$, i=1, 2, 3 . . . n) and separation of the snap-through events as indicated by the end shortening ($\delta_i$, i=1, 2, 3 . . . n). It should be noted that the magnitude of the first bifurcation event is not of primary interest. Rather, maximizing the number of load drops is of more importance. Lastly, it is of interest to maximize the enclosed area in the force-displacement response as it is associated with the dissipated energy from the equilibrium path transactions.

Research has shown that the geometry of a cylindrical shell dictates their buckling response, and that obtaining multiple local buckling patterns requires cylinders with a small length to radius ratio (L/R) and a large radius thickness (R/t) ratio. Thus, the base cylinder used for this study had an effective length of 203 mm and internal diameter of 203 mm. The thickness varied from 1.32 mm to 0.28 mm depending on the material design as described in the following sections. It is understood that cylinders having different dimensions fall within the scope of this disclosure. Further information for the buckling cylinder may be found in U.S. Patent Application Publication No. 2014/0070670 which is incorporated in its entirety by reference.

FIGS. 7A and 7B depict an example embodiment for an event logger 16. The event logger is comprised generally of a drive circuit and a non-volatile memory. In operation, the event logger is configured to receive the voltage from the transducer 14 and log the voltage in the non-volatile memory. In the example embodiment, the drive circuit is further defined as a current source $I_{ref}$ which may be implemented by a floating gate transistor operating in weak-inversion mode. The current reference circuit in turn injects current into the non-volatile memory which may also be comprised of a floating-gate pMOS transistor $M_{fg}$. The current source $I_{ref}$ may be powered by either the transducer 14 or by some other energy source $V_{dda}$. Note that both energy sources are isolated by a diode, which allows $V_{dda}$ to supersede the signal generated by the piezoelectric transducer. Also note that the full-bridge rectifier (formed by four diodes) is used for extracting energy from the transducer and drive the constant current source $I_{ref}$.

The polysilicon gate of the pMOS transistor is electrically insulated by silicon-dioxide (hence the name "floating-gate"); therefore, any electron injected onto the gate is retained for a longer period of time (8 bits precision for 8 years). Electrons are injected onto the floating-gate using an impact-ionized hot-electron injection (IHEI) process that involves applying $V_{sd}$>4.2V (in 0.5-µm CMOS process)

across the source and the drain terminal. The large electric field near the drain of the pMOS transistor creates impact-ionized hot-electrons. When the energy of these electrons exceeds the gate-oxide potential barrier (≈3.2 eV) they can get injected onto the floating-gate. IHEI current, $I_{inj}$, in a pMOS transistor is dependent on the transistor source current $I_s$, the source-to-drain voltage $V_{sd}$ and the gate-to-drain voltage $V_{gd}$ across the transistor. This dependence can be expressed in functional form as $$I_{inj} = f(I_s, V_{sd}, V_{gd}), \quad (1)$$

where f(•) is an arbitrary function that could be empirically determined. However, the circuit in FIG. 7A achieves stable and ultra-linear injection using a negative feedback loop formed by the opamp A and the floating-gate transistor $M_{fg}$. The source current is held constant at $I_{ref}$ which ensures that the source-to-gate voltage $V_{sg}$ remains constant during injection. When switch $S_P$ is open, the feedback is enabled and opamp A ensures that the source-to-drain voltage $V_{sd}$ is held constant to $V_{ref}$. Thus, according to equation (1) the injection current $I_{inj}$ remains constant. The amount of charge injected onto the floating-gate and hence the decrease in floating-gate voltage $V_{fg}$ is proportional to the duration for which the source current $I_s$ is activated and $S_P$ is open. This can be expressed as:

$$\Delta V_{fg} = \frac{1}{C_T} \int_0^T I_{inj} dt = \frac{I_{inj}}{C_T} \tau(T) \quad (2)$$

where $\tau$ is the duration of injection and $C_T$ is the total floating-gate capacitance, which includes the capacitance $C_{fg}$, tunneling capacitance and other parasitic capacitances associated with the floating node. The change in floating-gate voltage $\Delta V_{fg}$ could be measured by closing the switch $S_P$, as shown in FIG. 7B, which breaks the feedback loop by shorting the other terminal of $C_{fg}$ to ground. Because the source current $I_{ref}$ is constant, $\Delta V_s = \Delta V_{fg}$ which is read-out through a unity-gain buffer.

FIG. 8 shows the measured response of a linear injector where the source voltage $V_s$ is first initialized to 4.3V (using FN tunneling), $V_{ref}$=4.8V and $I_{ref}$=30 nA. It shows that the response follows the linear model almost throughout the range. The piezoelectric transducer is emulated by applying a 50 ms long pulse signal (amplitude $V_{dd}$=6.5V) after which the switch $S_P$ is turned ON and the source voltage $V_s$ is measured. FIG. 8 shows that the change in $V_s$ is linear with respect to the number of applied pulses. The deviation from the linear injection model occurs at the end points of the operating voltage and is due to the finite operating range of the amplifier A. This shows that the linear injector has a linear range of almost 4V. Further information regarding the example embodiment of the event logging circuit may be found in "Rail-to-Rail Hot-electron Injection Programming of Floating-gate Voltage Bias Generators at a Resolution of 13 bits" IEEE Journal of Solid-State Circuits, vol. 46, no. 1 Nov. 2011.

A micrograph of a p-IHEI based data logging circuit was fabricated in a 0.5 μm CMOS process. The prototype integrates an array of linear floating-gate injectors that can be programmed using on-chip high-voltage charge pumps. Programming, selection and read-out of the injectors can be controlled using digital command and control, which is implemented on-chip by an integrated digital processing module. Details of high-voltage programming and digital command and control are provided in "An Asynchronous Analog Self-powered Sensor-Data-Logger with a 13.56 MHz RF Programming Interface," IEEE Journal of Solid-State Circuits, February 2012 and has been omitted in this disclosure for the sake of brevity.

Figure 10A:
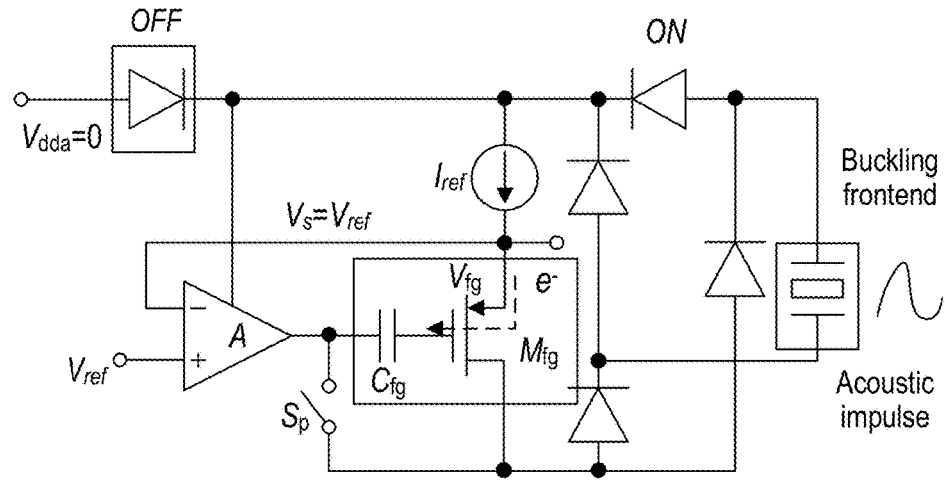
FIGS. 10A and 10B are schematics of an example logging circuit when operating in data logging mode and in data read-out mode, respectively.
Figure 10B:
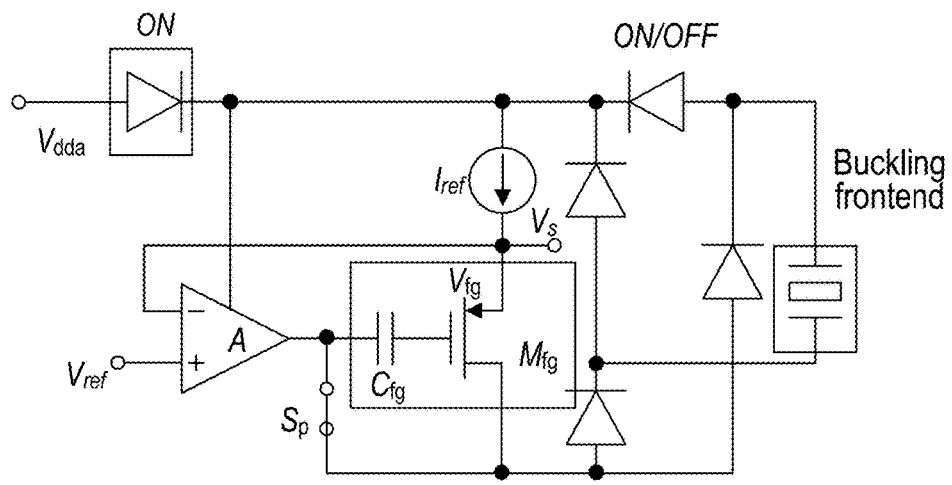
Figure 11:
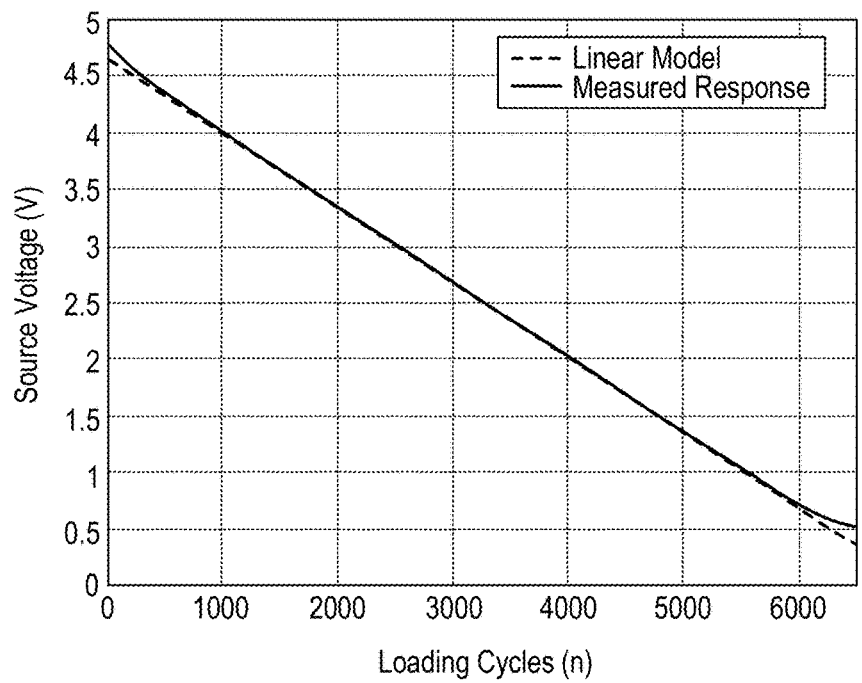
FIG. 11 is a graph depicting the measure output range and the linearity for linear injection circuit.

Two sets of experiments were conducted to validate the behavior of the described quasi-static sensing functionalities. In the first runs, the system was cycled between only two equilibrium positions (loading then unloading). The actuator, which applied the external force, was moved at a frequency of 0.1 Hz and then 0.5 Hz while the induced oscillations at the PVDF beam were measured at 12.82 Hz. FIG. 9 shows the applied input deformation (for a 0.1 Hz loading) and the rectified voltage output generated by the vibrating piezoelectric element. It is noted from the levels of generated voltage that the released energy is higher during loading when the applied force (added potential) is being increased. The combined piezoelectric-floating-gate event counting device was calibrated to detect and record voltages higher than 4V. The impact ionized hot-electron injection process at the floating gate memory cell is activated only when the voltage exceeds the preset threshold. For each event the gate is thus active for about 0.2 seconds. The voltage variations at the floating gate was measured periodically and is shown in FIGS. 10 and 11. The results in FIG. 10 were recorded for cyclic input loading events applied at 0.1 Hz while the measurements in FIG. 11 were obtained for an input loading applied at 0.5 Hz. It is observed that the system clearly implements a linear injector allowing to directly relate the number of applied events to the measured voltage variation at the floating gate output.

Figure 12:
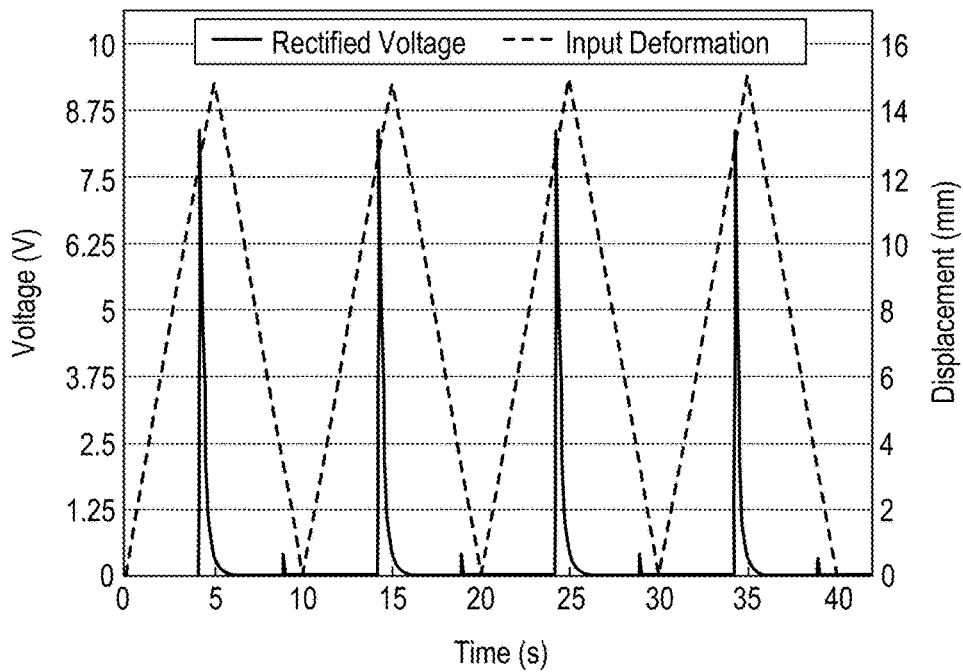
FIG. 12 is a graph depicting measured output piezoelectric voltage generated for loading cycles at 0.1 Hertz, showing the system's ability for energy generation under quasi-static loading.
Figure 13:
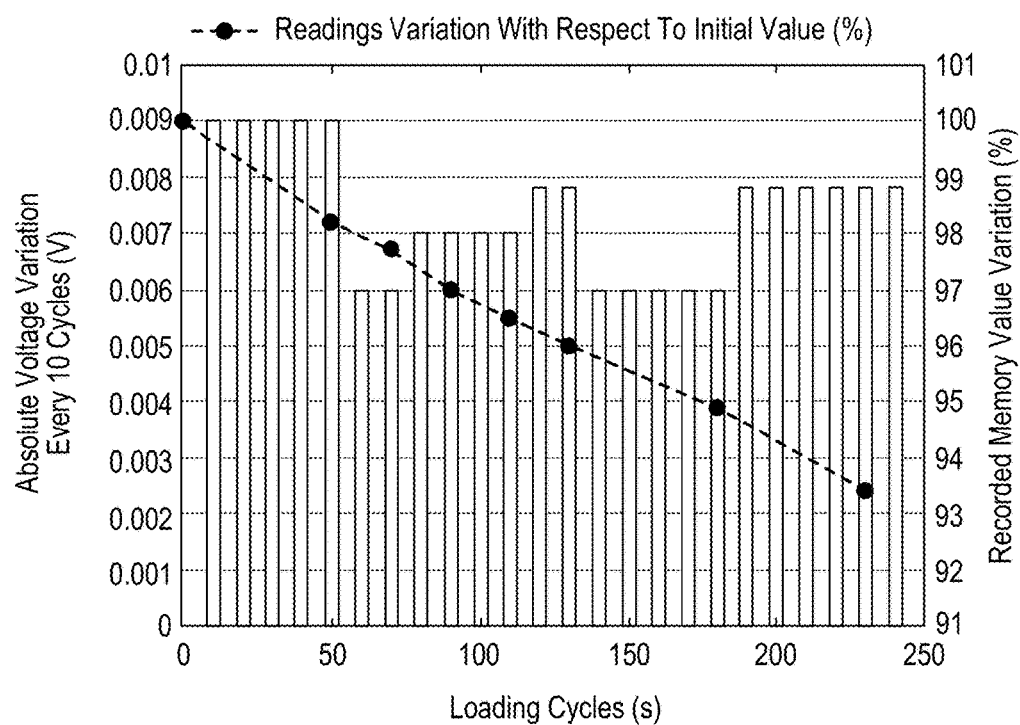
FIG. 13 is a graph depicting recorded variations of the voltage at the analog floating gate for input cyclic loading events at 0.1 Hertz.
Figure 14:
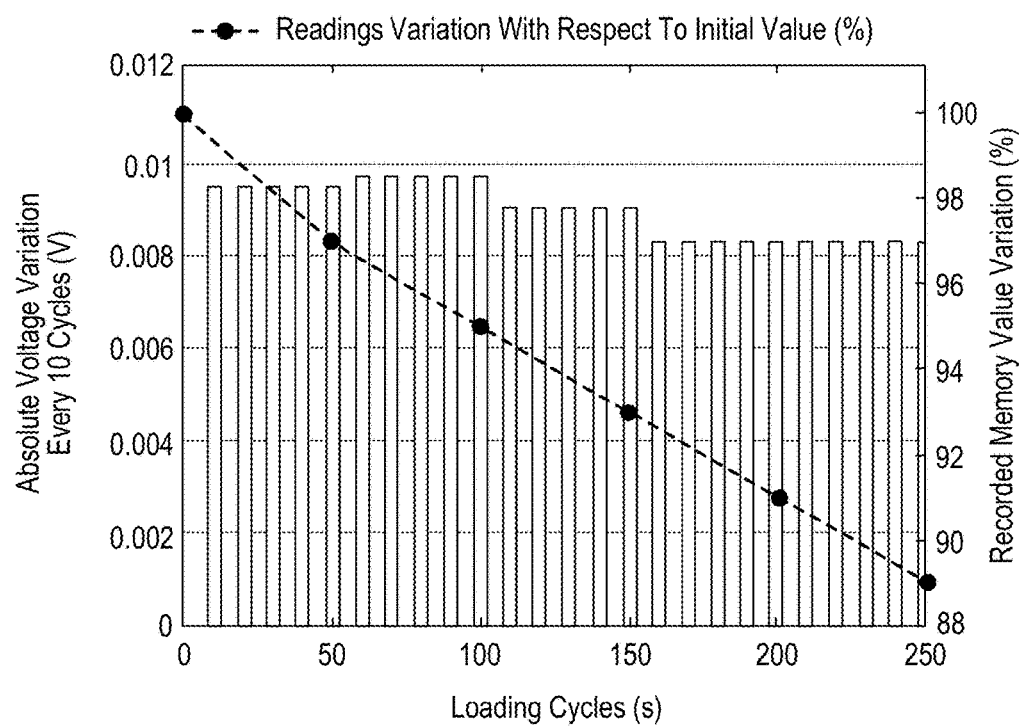
FIG. 14 is a graph depicting recorded variations of the voltage at the analog floating gate for input cyclic loading events at 0.5 Hertz.
Figure 15:
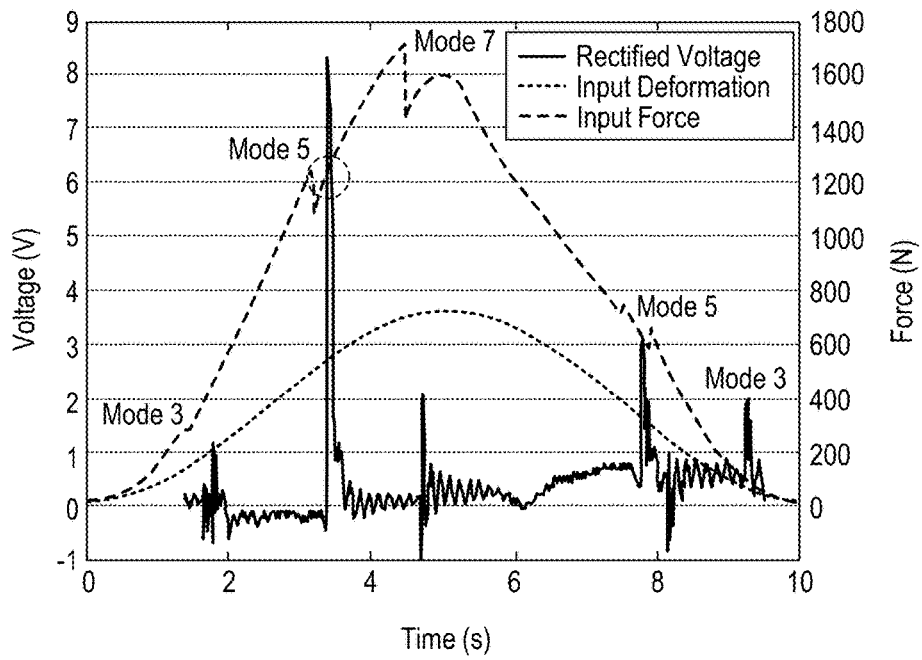
FIG. 15 is a graph illustrating the energy conversion principle under cyclic loading at 0.1 Hertz for the bilaterally constrained column configuration.
Figure 16:
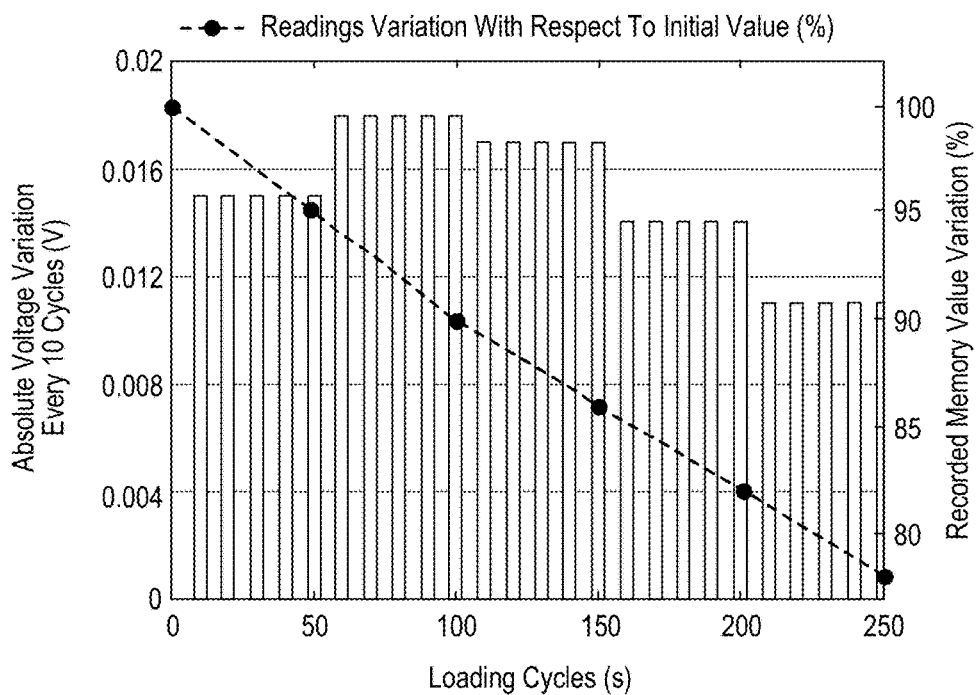
FIG. 16 is a graph depicting recorded variations of the voltage at the analog floating gate for input cyclic loading events at 0.1 Hertz.

In the next set of experiments the restrained strip was initially loaded past its fifth buckling mode which was selected as the starting configuration. Loading cycles were then applied between a maximum load past the seventh mode equilibrium position and a minimum load below the third stable configuration. The applied axial load, axial deformation, and the rectified voltage output from the PVDF transducer are shown in FIG. 12 as function of time. The input load varies at a frequency of about 0.1 Hz. At this rate the voltage response is driven by the natural frequency of the piezoelectric harvester. For this case the PVDF beam was tuned to 6 Hz. The combined piezoelectric-floating-gate event counting device was again calibrated to detect and record voltages higher than 4 V. For these specific experimental runs, the preset threshold is exceeded only during the snap-buckling from the third to the fifth mode as clearly shown in FIG. 12. This translates into a calibrated system that records only these transitions. The difference in voltage output between transitions is due to the levels of stored strain energy in the system before the transition events and can be turned and calibrated. FIG. 13 shows the recorded voltage variations at the linear injector. The sensor clearly implements a linear recording of events allowing direct correspondence between the number of applied events and the measured sensor output voltage.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A self-powered sensing system, comprising:
an energy concentrator having a member configured to detect a variation of a physical stimuli and change shape in response to the variation of the physical stimuli, where the variation occurs at a frequency less than one Hertz;
a transducer coupled to the member of the energy concentrator and generates a voltage in response to the change in shape of the member; and
an event logging circuit configured to receive the voltage from the transducer and operates to log the voltage in a non-volatile memory
wherein the member of the energy concentrator is defined as a strip having two opposing planar surfaces substantially wider than remaining surfaces, where the strip is constrained by a first wall disposed adjacent to one planar surface of the strip and a second wall disposed adjacent to other planar surface of the strip.

2. The self-powered sensing system of claim 1 wherein the member of the energy concentrator changes shape in response to a force applied thereto.

3. The self-powered sensing system of claim 1 wherein the member of the energy concentrator is interfaced with a structure to be monitored.

4. The self-powered sensing system of claim 1 wherein the transducer is defined as a cantilever having one end coupled to the strip, the cantilever extending outwardly from the strip and includes piezoelectric material disposed on a surface thereof.

5. The self-powered sensing system of claim 1 wherein the non-volatile memory is comprised of at least one floating gate transistor.

6. The self-powered sensing system of claim 5 wherein the event logging circuit includes a current reference circuit having a floating gate transistor operating in a weak-inversion mode, the current reference circuit configured to receive the voltage signal from the transducer and, in response thereto, output an injection current into the non-volatile memory.

7. The self-powered sensing system of claim 6 wherein the event logging circuit includes an operational amplifier interfaced with the floating gate transistor of the non-volatile memory to ensure that the source-to-drain voltage of the floating gate transistor is held constant.

8. The self-powered sensing system of claim 1 wherein the member of the energy concentrator changes shape in response to variation in one of temperature or pressure.

9. A self-powered sensing system, comprising:
an energy concentrator having a member configured to accumulate potential energy in response to variations of a physical stimuli applied thereto and to release the accumulated potential energy by changing shape when the accumulated potential energy exceeds a threshold, where the variation of the physical stimuli occurs at a frequency less than one Hertz;
a transducer coupled to the member of the energy concentrator and, in response to the change in shape of the member, generates a voltage; and
an event logging circuit configured to receive the voltage from the transducer and operates to log the voltage in a non-volatile memory.

10. The self-powered sensing system of claim 9 wherein the member of the energy concentrator is defined as a hollow cylinder configured to exhibits a snap-through event in response to a force applied axially thereto, where magnitude of the force changes at a frequency less than one Hertz and the snap-through event is constrained laterally by curvature of the cylinder.

11. The self-powered sensing system of claim 9 wherein the member of the energy concentrator changes shape in response to a force applied thereto.

12. The self-powered sensing system of claim 9 wherein the member of the energy concentrator is interfaced with a structure to be monitored.

13. The self-powered sensing system of claim 9 wherein the member of the energy concentrator is defined as a strip having two opposing planar surfaces substantially wider than remaining surfaces, where the strip is constrained by a first wall disposed adjacent to one planar surface of the strip and a second wall disposed adjacent to other planar surface of the strip.

14. The self-powered sensing system of claim 13 wherein the transducer is defined as a cantilever having one end coupled to the strip, the cantilever extending outwardly from the strip and includes piezoelectric material disposed on a surface thereof.

15. The self-powered sensing system of claim 9 wherein the non-volatile memory is comprised of at least one floating gate transistor.

16. The self-powered sensing system of claim 15 wherein the event logging circuit includes a current reference circuit having a floating gate transistor operating in a weak-inversion mode, the current reference circuit configured to receive the voltage signal from the transducer and, in response thereto, output an injection current into the non-volatile memory.

17. The self-powered sensing system of claim 16 wherein the event logging circuit includes an operational amplifier interfaced with the floating gate transistor of the non-volatile memory to ensure that the source-to-drain voltage of the floating gate transistor is held constant.

18. The self-powered sensing system of claim 9 wherein the member of the energy concentrator changes shape in response to variation in one of temperature or pressure.

* * * * *